(12) United States Patent
Wu et al.

(10) Patent No.: US 11,817,333 B2
(45) Date of Patent: Nov. 14, 2023

(54) MINIATURIZED SEMICONDUCTOR MANUFACTURING SYSTEM

(71) Applicant: Syskey Technology Co., Ltd., Hsinchu County (TW)

(72) Inventors: Hsueh-Hsien Wu, Hsinchu (TW); Chih-Yuan Chan, Hsinchu County (TW)

(73) Assignee: SYSKEY TECHNOLOGY CO., LTD., Hsinchu County (TW)

( * ) Notice: Subject to any disclaimer, the term of this patent is extended or adjusted under 35 U.S.C. 154(b) by 359 days.

(21) Appl. No.: 17/204,495

(22) Filed: Mar. 17, 2021

(65) Prior Publication Data

US 2022/0254665 A1   Aug. 11, 2022

(30) Foreign Application Priority Data

Feb. 5, 2021  (TW) ................................ 110104405

(51) Int. Cl.
| | | |
|---|---|---|
| *H01L 21/677* | (2006.01) | |
| *H01L 21/67* | (2006.01) | |
| *H01L 21/687* | (2006.01) | |

(52) U.S. Cl.
CPC .... *H01L 21/67207* (2013.01); *H01L 21/6719* (2013.01); *H01L 21/67023* (2013.01); *H01L 21/67706* (2013.01); *H01L 21/67724* (2013.01); *H01L 21/67742* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 2015/0311101 A1* | 10/2015 | Hara | ................. H01L 21/67742 |
| | | | 414/222.07 |
| 2021/0050242 A1* | 2/2021 | Sakata | .............. H01L 21/67778 |

* cited by examiner

*Primary Examiner* — Binu Thomas
(74) *Attorney, Agent, or Firm* — Muncy, Geissler, Olds & Lowe, P.C.

(57) ABSTRACT

A miniaturized semiconductor manufacturing system including: a housing, a lifting mechanism, a processing chamber and a transportation mechanism. The housing includes an inner space and an opening communicated with the inner space. The lifting mechanism is disposed in the inner space and includes a holder configured for a substrate to be placed thereon. The holder is movable in a first direction relative to the opening between a first position and a second position. The processing chamber is disposed in the inner space and includes a holding portion configured for the substrate to be placed thereon. The transportation mechanism is disposed between the lifting mechanism and the processing chamber and is movable in a second direction. Wherein an aspect ratio value of the housing is between 1 to 6.

9 Claims, 12 Drawing Sheets

MINIATURIZED SEMICONDUCTOR MANUFACTURING SYSTEM

CROSS REFERENCE TO RELATED APPLICATIONS

This application claims priority of Application No. 110104405 filed in TW on Feb. 5, 2021 under 35 U.S.C. § 119, the entire content of which is hereby incorporated by reference.

BACKGROUND OF THE INVENTION

Field of the Invention

The present invention relates to a miniaturized semiconductor manufacturing system.

Description of the Prior Art

Vacuum technology plays an important role in the semiconductor industry. Semiconductor manufacturing processes such as sputtering, lithography, and etching require to be performed in a vacuum chamber to reduce the influence of gas molecules on a substrate to be processed and ensure production quality.

In the semiconductor manufacturing processes, large-size wafers are usually selected to use for mass production, and robotic arms are configured to transfer the large-size wafers between processing chambers and storage spaces for continuous processing and manufacturing of semiconductor components. However, a conventional vacuum system requires large space to storage and transfer the wafers, which results in a large device volume, high construction cost, long manufacturing times and poor production efficiency and is easy to cause waste of costs in small batch production.

The present invention is, therefore, arisen to obviate or at least mitigate the above-mentioned disadvantages.

SUMMARY OF THE INVENTION

The main object of the present invention is to provide a miniaturized semiconductor manufacturing system which has a small device volume and low manufacturing cost.

To achieve the above and other objects, the present invention provides a miniaturized semiconductor manufacturing system, including: a housing, a lifting mechanism, a processing chamber and a transportation mechanism. The housing includes an inner space and an opening communicated with the inner space. The lifting mechanism is disposed in the inner space and includes a holder configured for a substrate to be placed thereon. The holder is movable in a first direction relative to the opening between a first position and a second position. The processing chamber is disposed in the inner space and includes a holding portion configured for the substrate to be placed thereon. The transportation mechanism is disposed between the lifting mechanism and the processing chamber and is movable in a second direction, and the transportation mechanism is configured to transport the substrate between the holder and the holding portion. Wherein an aspect ratio value of the housing is between 1 to 6. When the holder is in the first position, the holder is at least partially located within the opening; when the holder is in the second position, the transportation mechanism corresponds to the holder so as to take the substrate from the holder or place the substrate on the holder.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Please refer to FIGS. 1 to 12 for a preferable embodiment of the present invention. A miniaturized semiconductor manufacturing system 1 of the present invention includes a housing 10, a lifting mechanism 20, a processing chamber 30 and a transportation mechanism 40.

Figure 1:
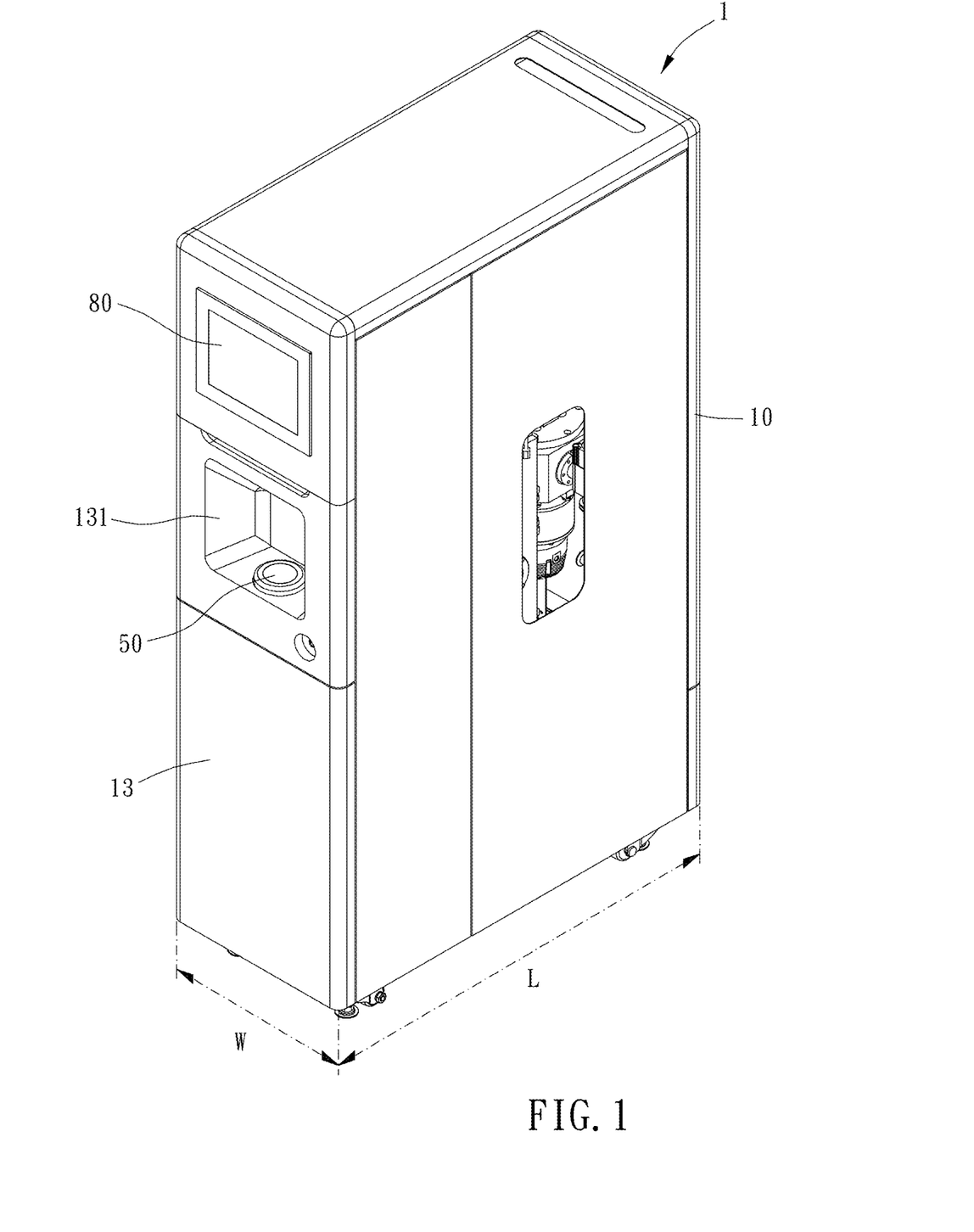
FIG. 1 is a stereogram of a preferable embodiment of the present invention.
Figure 2:
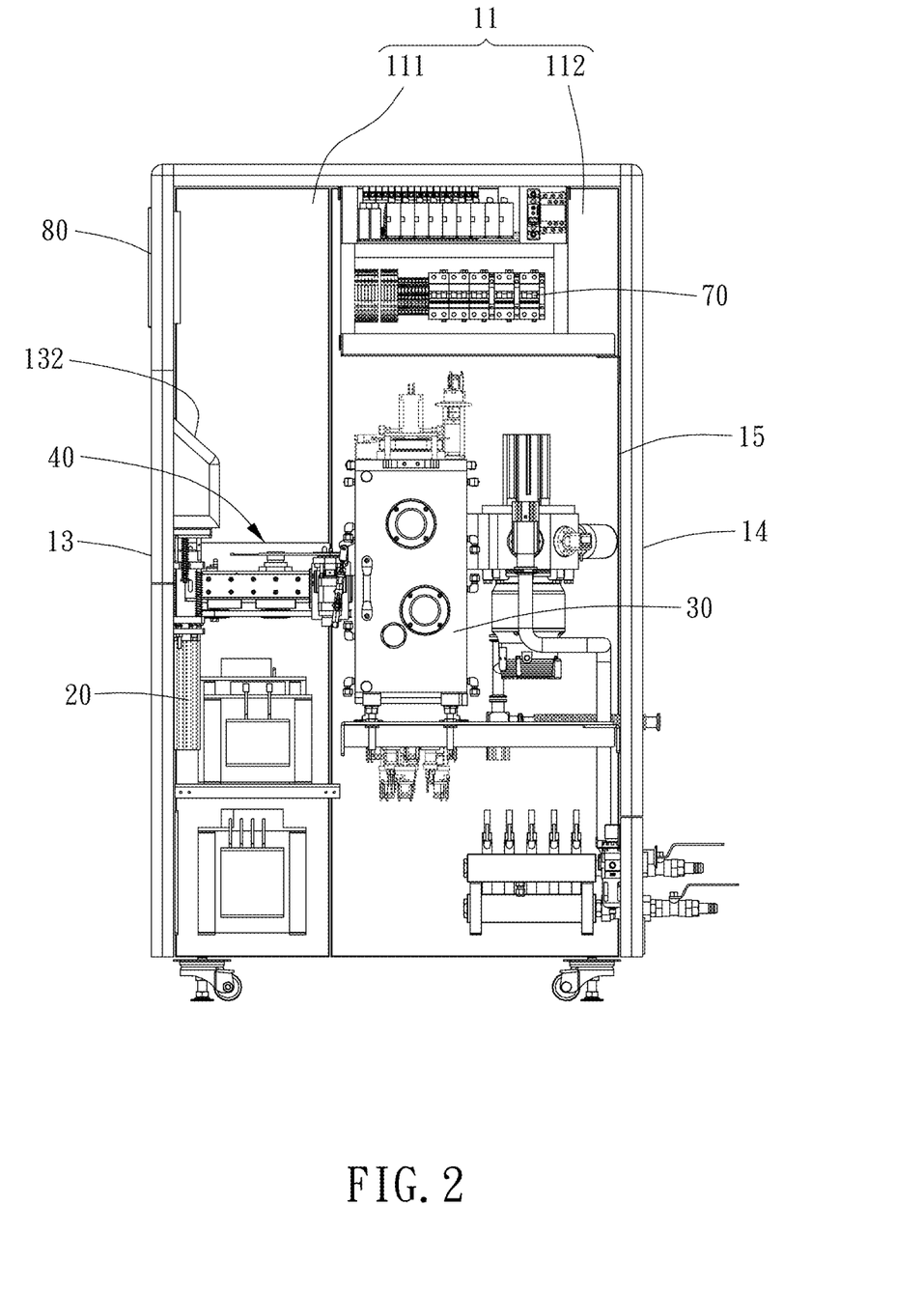
FIG. 2 is a side view of a preferable embodiment of the present invention.
Figure 3:
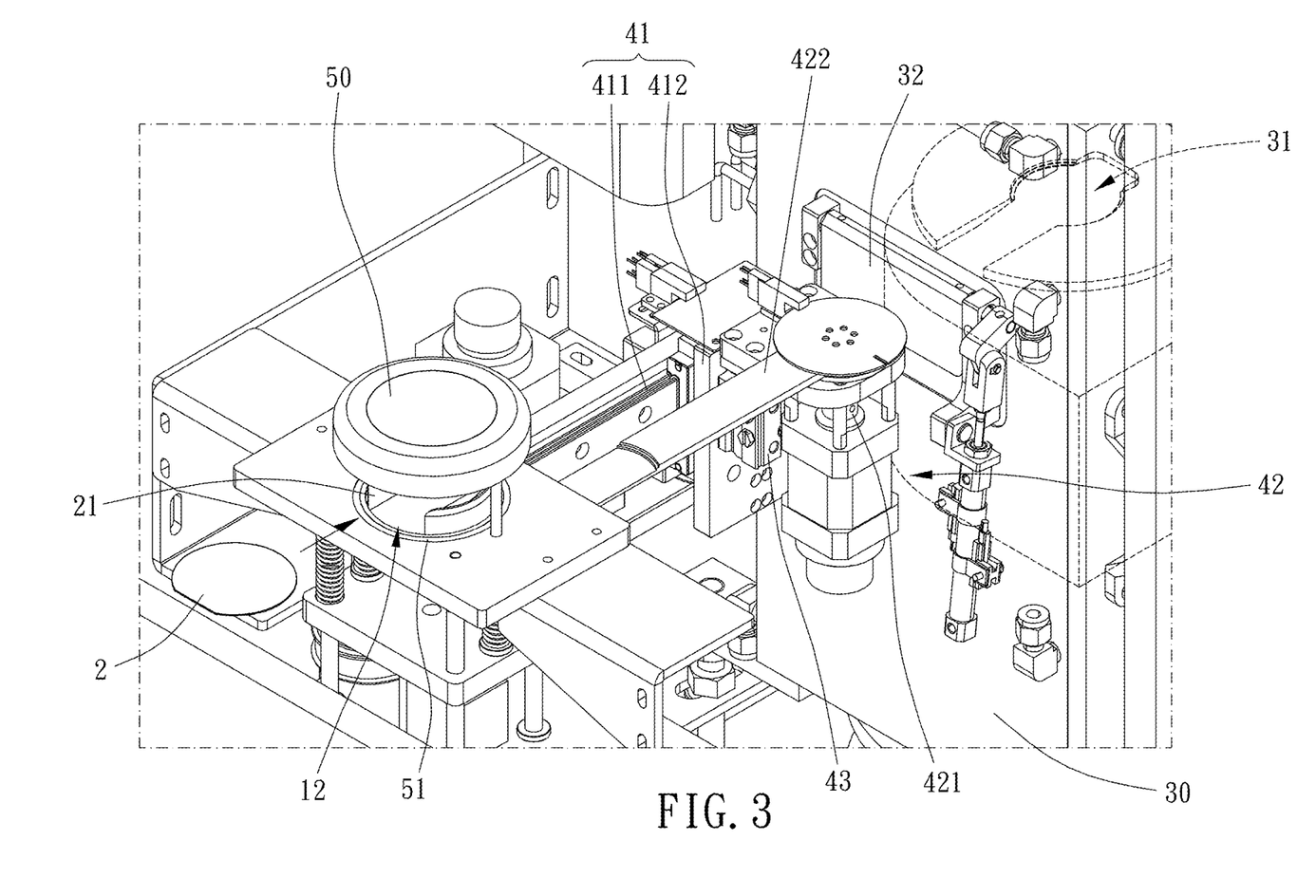
FIG. 3 is a partial enlargement of a preferable embodiment of the present invention when a holder is in a first position.
Figure 4:
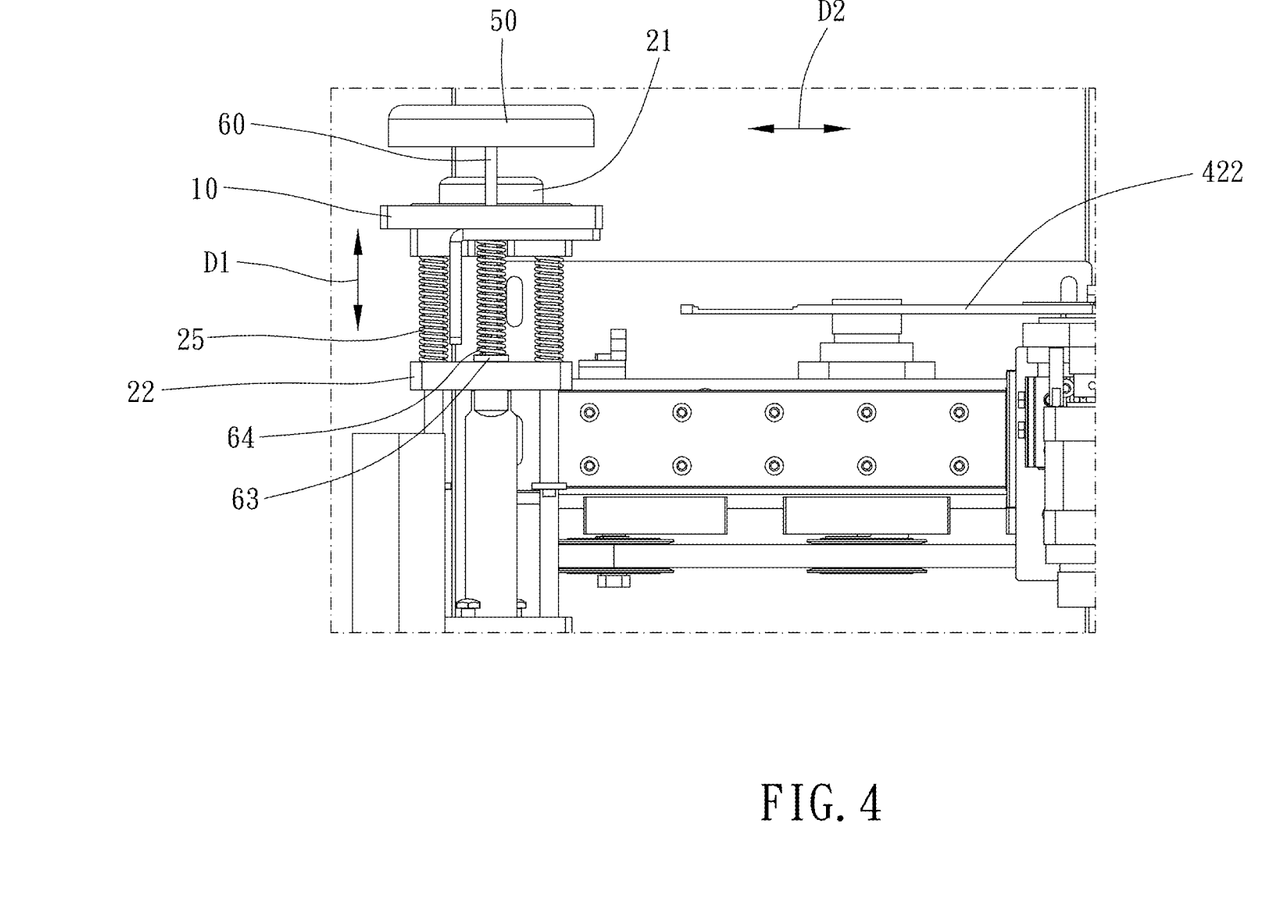
FIG. 4 is a partial side view of a preferable embodiment of the present invention when the holder is in the first position.
Figure 6:
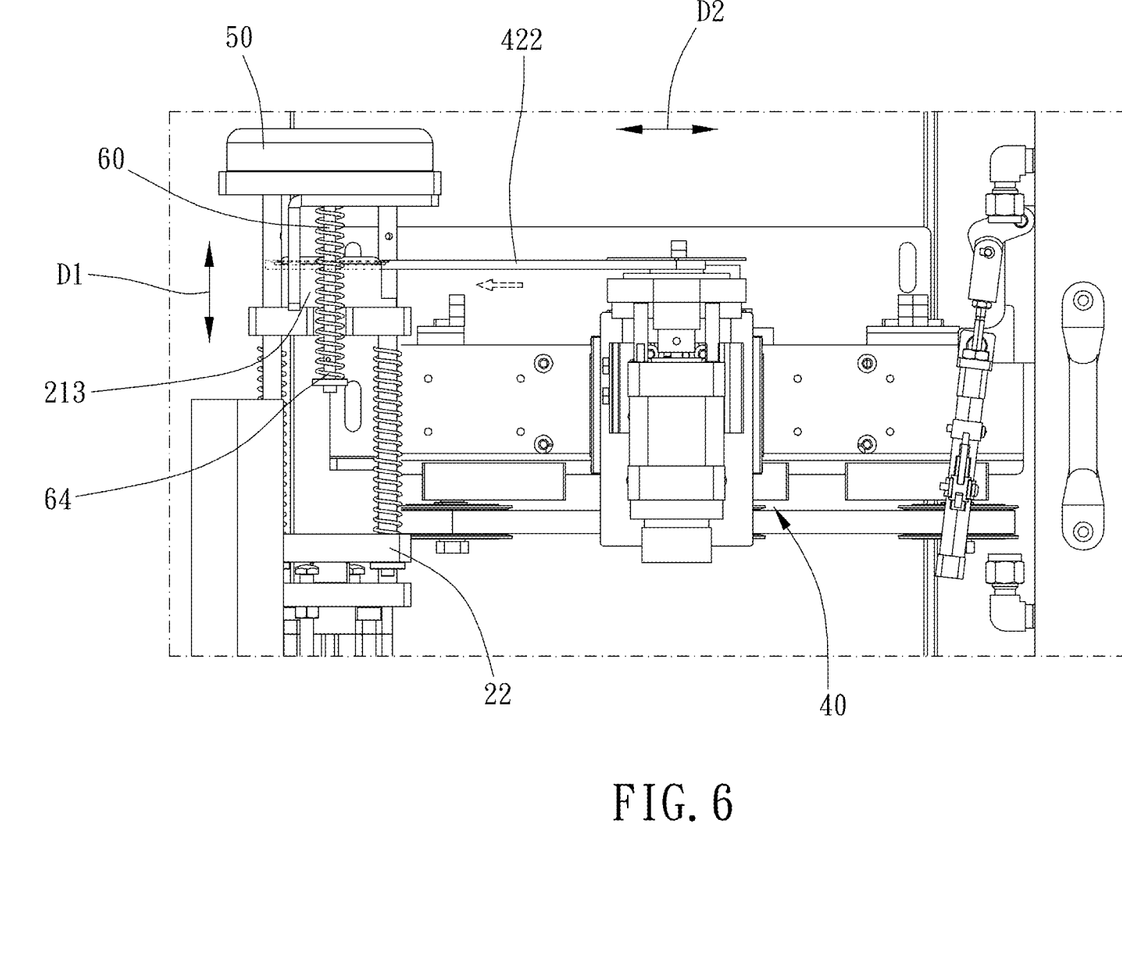
FIGS. 6 and 7 are drawings showing a moving arm taking a substrate from the holder according to a preferable embodiment of the present invention.

The housing 10 includes an inner space 11 and an opening 12 communicated with the inner space 11. The lifting mechanism 20 is disposed in the inner space 11 and includes a holder 21 configured for a substrate 2 to be placed thereon, and the holder 21 is movable in a first direction D1 relative to the opening 12 between a first position and a second position. The processing chamber 30 is disposed in the inner space 11 and includes a holding portion 31 configured for the substrate 2 to be placed thereon. The transportation mechanism 40 is disposed between the lifting mechanism 20 and the processing chamber 30 and is movable in a second direction D2. The transportation mechanism 40 is configured to transport the substrate 2 between the holder 21 and the holding portion 31. An aspect ratio value (length/width) of the housing 10 is between 1 to 6. When the holder 21 is in the first position, the holder 21 is at least partially located within the opening 12 so that the substrate 2 can be taken or placed from external environment, as shown in FIG. 3; when the holder 21 is in the second position, the transportation mechanism 40 corresponds to the holder 21 and is configured to take the substrate 2 from the holder 21 or place the substrate 2 on the holder 21, as shown in FIG. 6. Therefore, the miniaturized semiconductor manufacturing system 1 has a small volume and low manufacturing cost, which is suitable for small batch production in research and development and testing stage, etc.

Preferably, the miniaturized semiconductor manufacturing system 1 further includes a cover 50 openably covered the opening 12 and at least one actuating rod 60 connected with the cover 50. Each of the at least one actuating rod 60 includes a first end 61 connected with the cover 50 and a second end 62 opposite to the first end 61 and protruding into the inner space 11. When the holder 21 is moving toward the first position, the lifting mechanism 20 is abutted against the second end 62 and the at least one actuating rod 60 drives the cover 50 to move away from the opening 12 so that the cover 50 can be opened automatically. In this embodiment, the at least one actuating rod 60 is slidably disposed through the housing 10; the lifting mechanism 20 further includes a movable platform 22 spacingly connected with the holder 21 and a lifting driving unit 23 driving the movable platform 22. Therefore, the lifting driving unit 23 can drive the movable platform 22 to move, and the movable platform 22 drives the holder 21 to move in the first direction D1; the movable platform 22 is abuttable against the second end 62 of the at least one actuating rod 60, which provides smooth operation and stable movement. Preferably, each of the at least one actuating rod 60 further includes a blocking portion 63 extending radially and a first elastic member 64 sleeved thereto and elastically abutted against and between the housing 10 and the blocking portion 6 so that each of the at least one actuating rod 60 has a tendency to move in a direction away from the opening 12. When the holder 21 is moving toward the second position, the at least one actuating rod 60 drives the cover 50 to cover the opening 12 so as to prevent foreign objects from entering the inner space 11. In this embodiment, each said blocking portion 63 is a nut, which has a simple structure and is easy to assemble; a sealing member 51 is preferably disposed between the cover 50 and a circumferential wall of the opening 12 so as to have good sealing effect; the holder 21 has at least one guiding slot 211 corresponding to the at least one actuating rod 60, and each of the at least one actuating rod 60 is movably disposed through one of the at least one guiding slot 211 so as to guide movement of the holder 21; two said actuating rods 60 are disposed on two opposite sides of the opening 12, which provides stable movement of the cover 50 and the two said actuating rods 60. However, each said blocking portion may be integrally formed on one said actuating rods; each of the two said actuating rods may not be provided with the first elastic member, and the cover may be covered on the opening by hand; the number and position of said actuating rods can be changed according to structural requirements.

Figure 5:
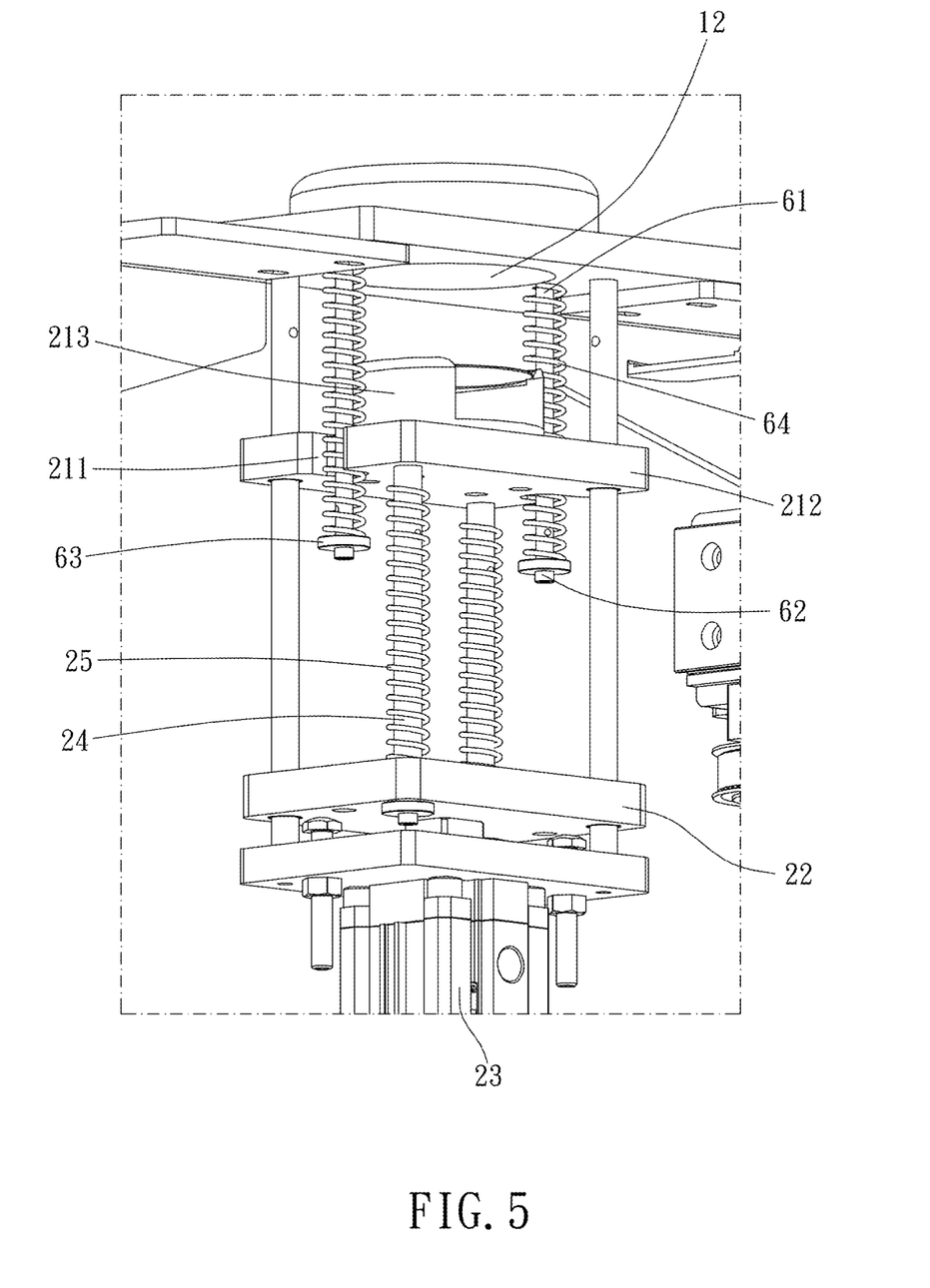
FIG. 5 is a partial enlargement of a preferable embodiment of the present invention when the holder is in a second position.

Specifically, the lifting mechanism 20 further includes a plurality of connecting rods 24 connected the movable platform 22 with the holder 21 and at least one second elastic member 25 sleevingly disposed on at least one of the plurality of connecting rods 24, and each of the at least one second elastic member 25 is abutted against and between the movable platform 22 and the holder 21 so as to provide cushioning effect. Please refer to FIGS. 3 and 4, in operation, the movable platform 22 is lifted up and drives the holder 21 to move toward the first position. When the holder 21 is abutted against the housing 10 in the first direction D1, the movable platform 22 continues to be lifted up, compress the at least one second elastic member 25 and abut against the second end 62 of each of the two said actuating rods 60, which allows the cover 50 to be opened. After that, the movable platform 22 is descended and drives the holder 21 to move toward the second position. When the movable platform 22 is descended to be free of abutment with the two said actuating rods 60, the first elastic member 64 stretches and drives the two said actuating rods 60 to move and the opening 12 is covered with the cover 50, as shown in FIGS. 5 and 6.

Figure 7:
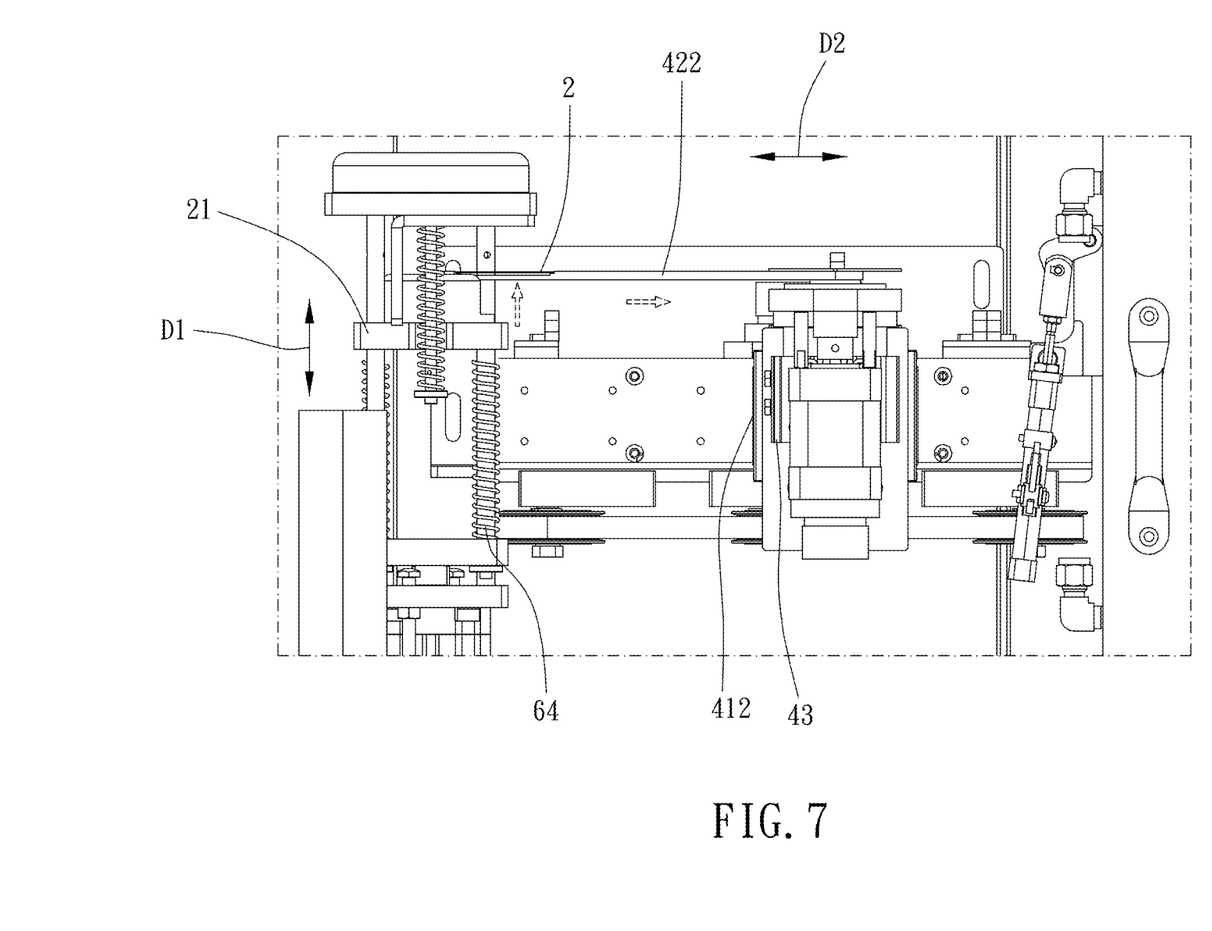

The transportation mechanism 40 includes a translation module 41 and a rotation module 42 disposed on the translation module 41, and the rotation module 42 includes a shaft 421 parallel to the first direction D1 and a moving arm 422 which is rotatable about the shaft 421 and is configured to take or place the substrate 2. Specifically, the translation module 41 includes a sliding rail 411 which extends in a direction parallel to the second direction D2 and is disposed on the housing 10 and a sliding base 412 movably disposed on the sliding rail 411, and the rotation module 42 is disposed on the sliding base 412 so that the sliding base 412 can drive the rotation module 42 to move laterally and shorten transferring distance. The lifting mechanism 20, the translation module 41 and the rotation module 42 are preferably actuatable synchronously, which effectively shortens transferring distance and reduces space required for the transportation mechanism 40, therefore, a volume of the miniaturized semiconductor manufacturing system 1 is effectively minimized. Preferably, the transportation mechanism 40 further includes a lifting module 43 disposed between the translation module 41 and the rotation module 42, and the moving arm 422 is drivable by the lifting module 43 to move in a direction parallel to the first direction D1. In this embodiment, the holder 21 includes a base 212 connected with the movable platform 22 and two holding arms 213 protruding from the base 212 and spaced apart from each other, and the two holding arms 213 are configured for the substrate 2 to be placed thereon. An end of the moving arm 422 has a receiving portion 423 configured to receive the substrate 2; when the holder 21 is in the second position, the translation module 41 drives the moving arm 422 to move along the second direction D2 and the receiving portion 423 is located between the two holding arms 213 (as shown in FIG. 6), and then the lifting module 43 drives the moving arm 422 to move relative to the holder 21 along the first direction D1 so as to take the substrate 2 or place the substrate 2 (as shown in FIG. 7).

Figure 8:
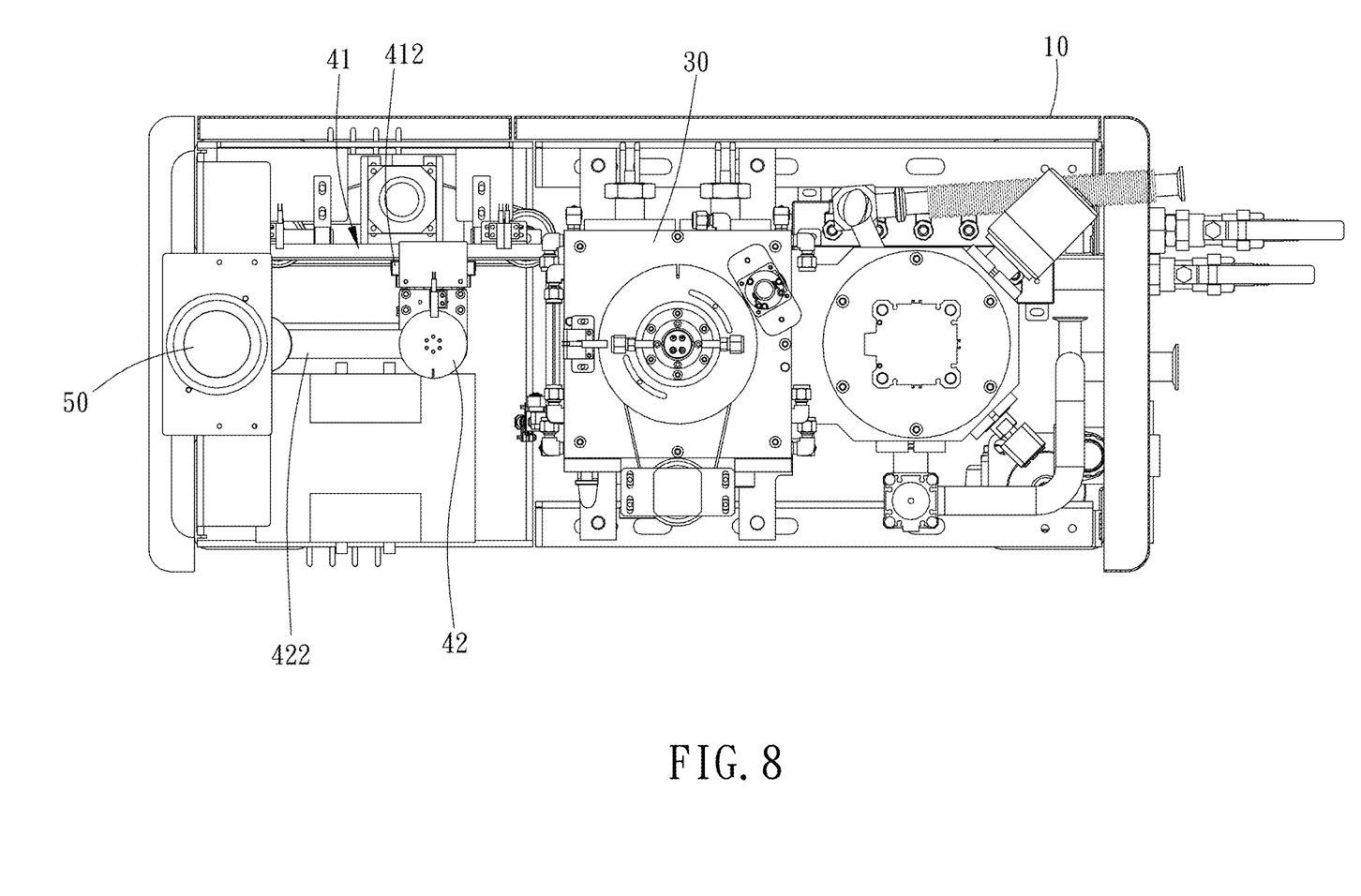
FIGS. 8-12 are drawings showing operation according to a preferable embodiment of the present invention.
Figure 9:
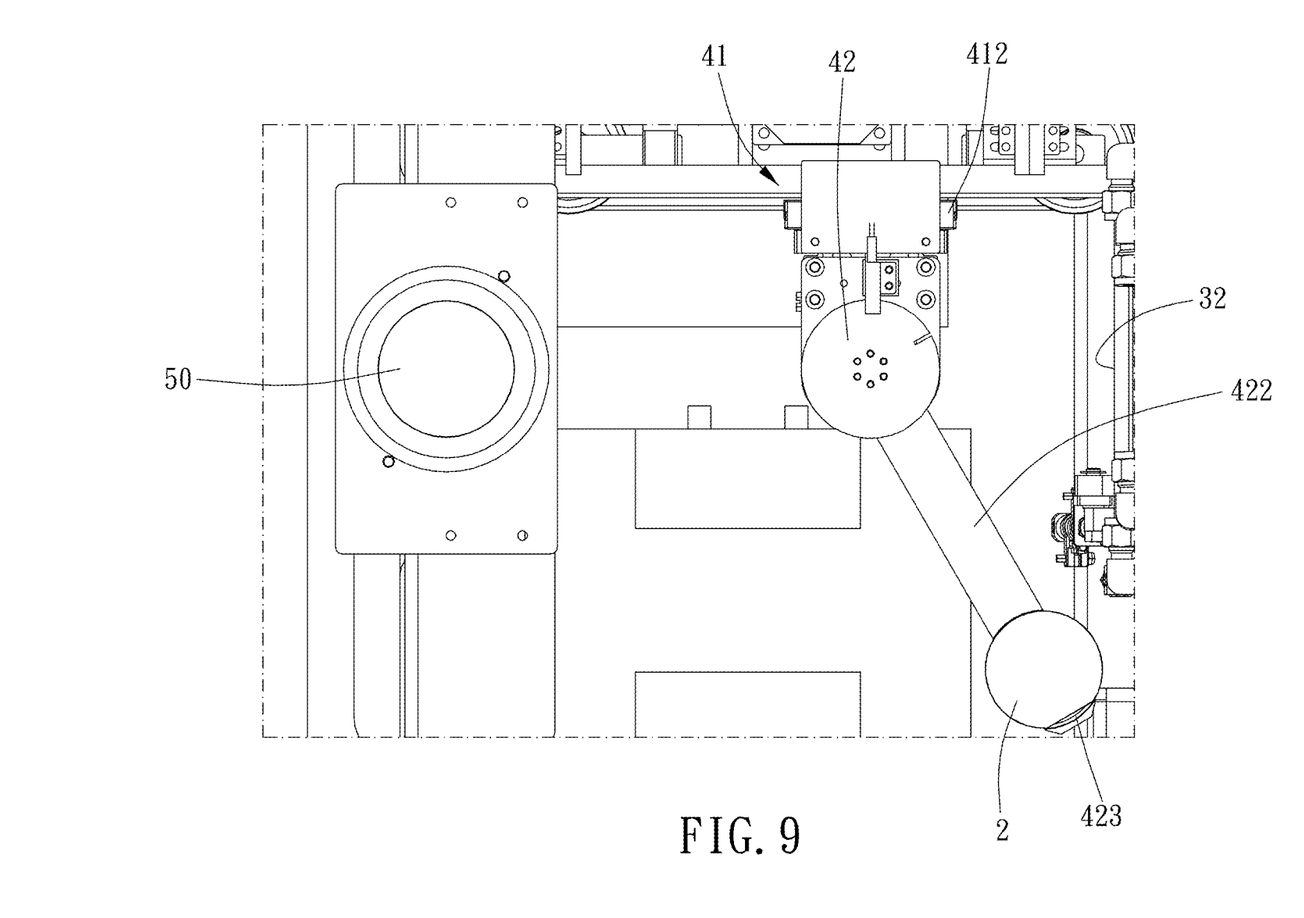
Figure 10:
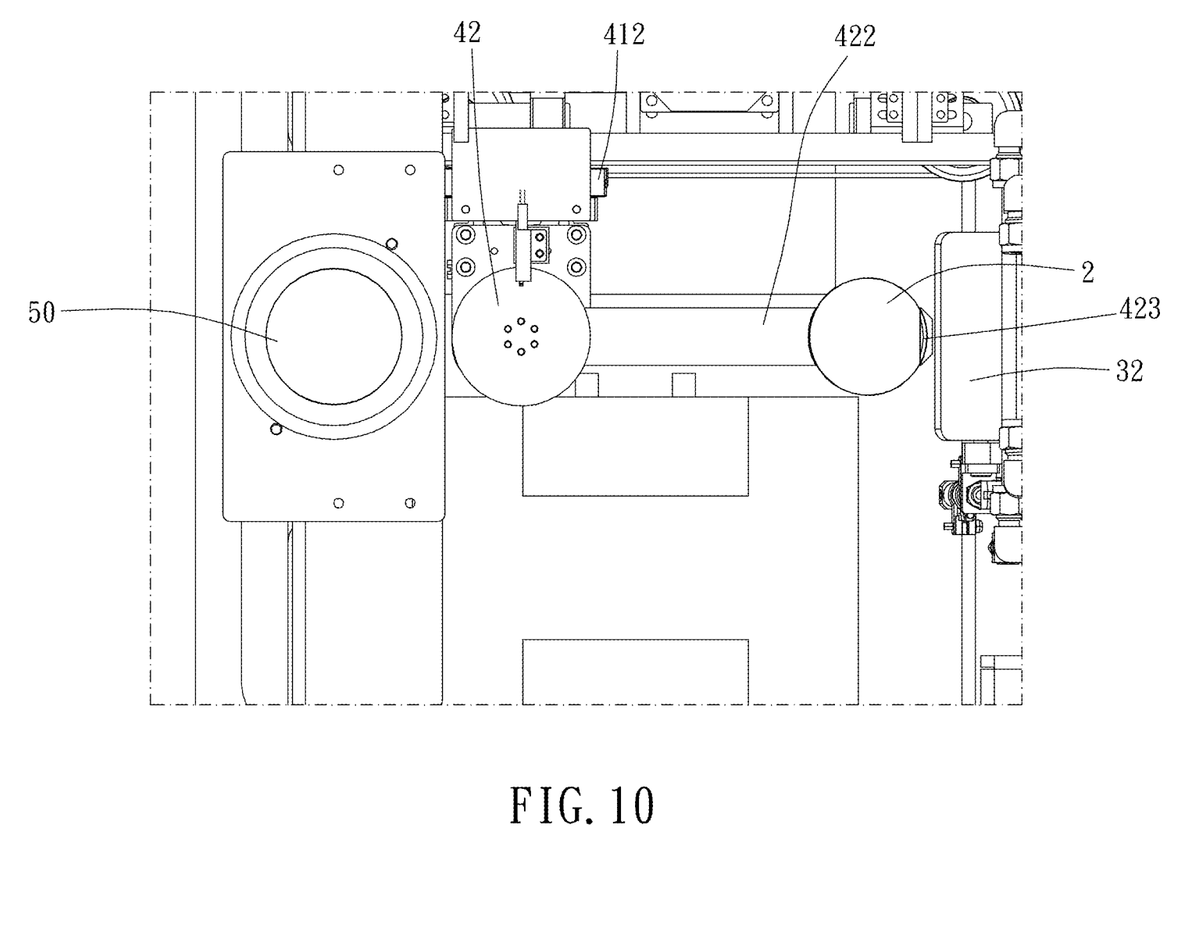
Figure 11:
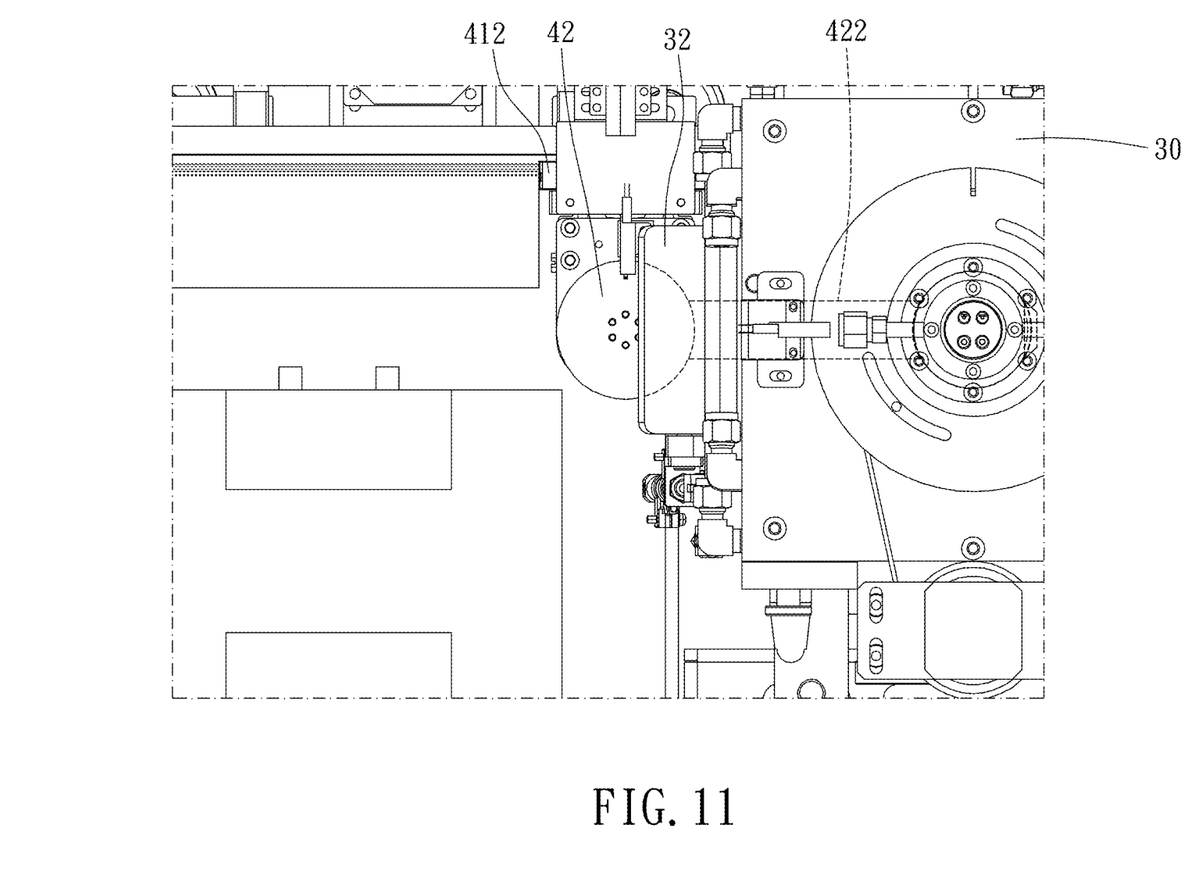
Figure 12:
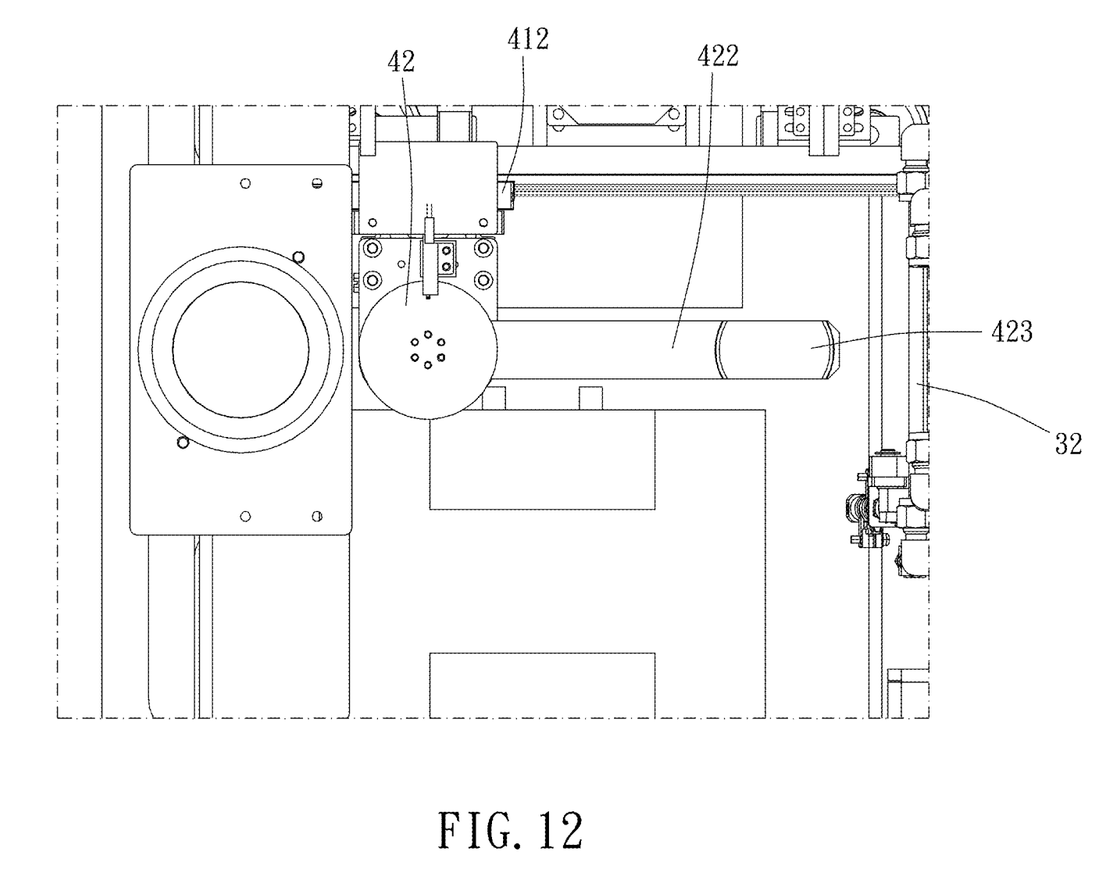

Please refer to FIGS. 8 and 9, after the substrate 2 is taken by the moving arm 422, the sliding base 412 drives the moving arm 422 to move away from the holder 21, and the shaft 421 drives the moving arm 422 to rotate toward the processing chamber 30. When the receiving portion 423 is close to the processing chamber 30, the sliding base 412 synchronously drives the moving arm 422 to move along the second direction D2 and toward the holder 21, which allows the moving arm 422 to rotate and allows the receiving portion 423 to correspond to the holding portion 31, as shown in FIG. 10. The processing chamber 30 further includes a door 32 corresponding to the holding portion 31. When the door 32 is opened, the transportation mechanism 40 can be moved within the processing chamber 30 and take the substrate 2 from the holding portion 31 or place the substrate 2 on the holding portion 31, as shown in FIG. 11. After that, the sliding base 412 drives the moving arm 422 to move out of the processing chamber 30, and the door 32 is closed for subsequent processing, as shown in FIG. 12. The processing chamber 30 can be airtight and decompressed to a vacuum state according to the process requirements. The processing chamber 30 may include related processing components such as a sputtering module, a thin film deposition module, or a thermal evaporation film module according to required equipment functions. A size of the substrate 2 is preferably smaller than or equal to 2 inches, which can effectively reduce material loss and shorten the process time.

The miniaturized semiconductor manufacturing system 1 further includes an electronic control unit 70 and an operation display interface 80 electrically connected with the electronic control unit 70. The operation display interface 80 is disposed on the housing 10 and configured to be operated externally, and the electronic control unit 70 is electrically connected with the lifting mechanism 20, the processing chamber 30 and the transportation mechanism 40 so that the operation display interface 80 can control various parameters of the processing chamber 30, such as pressure, temperature and light source intensity in the processing chamber 30, opening and closing of the door 32, etc., and the operation display interface 80 can also control operation of the lifting mechanism 20 and the transportation mechanism 40.

A length L of the housing 10 is smaller than or equal to 1.6 m, and a width W of the housing 10 is smaller than or equal to 0.5 m so as to effectively reduce an area occupied by the miniaturized semiconductor manufacturing system 1. Moreover, the housing 10 includes a front side panel 13 and a rear side panel 14. The front side panel 13 includes a concave portion 131 which is enclosed circumferentially and is concave in a direction toward the rear side panel 14, and a sidewall of the concave portion 131 has the opening 12 disposed therethrough so as to prevent foreign objects from entering the opening 12 or colliding the holder 21. Preferably, a sidewall 132 of the concave portion 131 facing the opening 12 extends obliquely and close to the opening 12 inwardly, which is convenient to take or place the substrate 2. However, every adjacent two sidewalls of the concave portion may be vertically connected with each other. In this embodiment, the housing 10 further includes an assembling frame 15, and the front side panel 13 and the rear side panel 14 are covered on the assembling frame 15. The lifting mechanism 20, the transportation mechanism 40, the processing chamber 30 and the electronic control unit 70 are detachably assembled to the assembling frame 15 so as to have good assembling stability and structural strength and be convenient to manufacture and replacement. The assembling frame 15 divides the inner space 11 into a first area 111 and a second area 112, the lifting mechanism 20 and the transportation mechanism 40 are located within the first area 111, and the processing chamber 30 is located within the second area 112; the electronic control unit 70 is located within the second area 112 and above the processing chamber 30 so as to shorten wiring distance. With the arrangement as described above, the inner space 11 is effectively used so as to minimize the volume of the miniaturized semiconductor manufacturing system 1.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A miniaturized semiconductor manufacturing system, including:
a housing, including an inner space and an opening communicated with the inner space;
a lifting mechanism, disposed in the inner space and including a holder configured for a substrate to be placed thereon, the holder being movable in a first direction relative to the opening between a first position and a second position;
a processing chamber, disposed in the inner space and including a holding portion configured for the substrate to be placed thereon; and
a transportation mechanism, disposed between the lifting mechanism and the processing chamber and being movable in a second direction, configured to transport the substrate between the holder and the holding portion;
wherein ratio value of a length to a width of the housing is between 1 to 6; when the holder is in the first position, the holder is at least partially located within the opening; when the holder is in the second position, the transportation mechanism corresponds to the holder and is configured to take the substrate from the holder or place the substrate on the holder;
wherein the miniaturized semiconductor manufacturing system further includes a cover openably covered the opening and at least one actuating rod connected with the cover, each of the at least one actuating rod includes a first end connected with the cover and a second end opposite to the first end and protruding into the inner space; and when the holder is moving toward the first position, the lifting mechanism is abutted against the second end and the at least one actuating rod drives the cover to move away from the opening.

2. The miniaturized semiconductor manufacturing system of claim 1, wherein the transportation mechanism includes a translation module and a rotation module disposed on the translation module, and the rotation module includes a shaft parallel to the first direction and a moving arm which is rotatable about the shaft and is configured to take or place the substrate.

3. The miniaturized semiconductor manufacturing system of claim 2, wherein the translation module includes a sliding rail which extends in a direction parallel to the second direction and is disposed on the housing and a sliding base movably disposed on the sliding rail, and the rotation module is disposed on the sliding base.

4. The miniaturized semiconductor manufacturing system of claim 2, wherein the transportation mechanism further includes a lifting module disposed between the translation module and the rotation module, and the moving arm is drivable by the lifting module to move in a direction parallel to the first direction.

5. The miniaturized semiconductor manufacturing system of claim 1, further including an electronic control unit and an operation display interface electrically connected with the electronic control unit, wherein the operation display interface is disposed on the housing and configured to be operated externally, and the electronic control unit is electrically connected with the lifting mechanism, the processing chamber and the transportation mechanism.

6. The miniaturized semiconductor manufacturing system of claim 1, wherein the housing includes a front side panel and a rear side panel, the front side panel includes a concave portion which is enclosed circumferentially and is concave in a direction toward the rear side panel, and a sidewall of the concave portion has the opening disposed therethrough.

7. The miniaturized semiconductor manufacturing system of claim 1, wherein the length of the housing is smaller than or equal to 1.6 m, and the width of the housing is smaller than or equal to 0.5 m.

8. The miniaturized semiconductor manufacturing system of claim 1, wherein each of the at least one actuating rod further includes a blocking portion extending radially and a first elastic member sleeved thereto and elastically abutted against and between the housing and the blocking portion.

9. The miniaturized semiconductor manufacturing system of claim 4, wherein the translation module includes a sliding rail which extends in a direction parallel to the second direction and is disposed on the housing and a sliding base movably disposed on the sliding rail, and the rotation module is disposed on the sliding base; the lifting mechanism, the translation module and the rotation module are actuatable synchronously; the processing chamber further includes a door corresponding to the holding portion; the miniaturized semiconductor manufacturing system further includes an electronic control unit and an operation display interface electrically connected with the electronic control unit, wherein the operation display interface is disposed on the housing and configured to be operated externally, the electronic control unit is electrically connected with the lifting mechanism, the processing chamber and the transportation mechanism; the housing includes a front side panel and a rear side panel, the front side panel includes a concave portion which is enclosed circumferentially and is concave in a direction toward the rear side panel, and a sidewall of the concave portion has the opening disposed therethrough; a sidewall of the concave portion facing the opening extends obliquely and close to the opening inwardly; the length of the housing is smaller than or equal to 1.6 m, and the width of the housing is smaller than or equal to 0.5 m; the at least one actuating rod is slidably disposed through the housing; the lifting mechanism further includes a movable platform spacingly connected with the holder and a lifting driving unit driving the movable platform, the movable platform drives the holder to move in the first direction; when the holder is moving toward the first position, the movable platform is abutted against the second end and the at least one actuating rod drives the cover to move away from the opening; each of the at least one actuating rod further includes a blocking portion extending radially and a first elastic member sleeved thereto and elastically abutted against and between the housing and the blocking portion; the holder has at least one guiding slot corresponding to the at least one actuating rod, each of the at least one actuating rod is movably disposed through one of the at least one guiding slot; the lifting mechanism further includes a plurality of connecting rods connected the movable platform with the holder and at least one second elastic member sleevingly disposed on at least one of the plurality of connecting rods, each of the at least one second elastic member is abutted against and between the movable platform and the holder; the housing further includes an assembling frame, the front side panel and the rear side panel are covered on the assembling frame; the assembling frame divides the inner space into a first area and a second area, the lifting mechanism and the transportation mechanism are located within the first area, the processing chamber is located within the second area; and the electronic control unit is located within the second area and above the processing chamber.

\* \* \* \* \*